(12) United States Patent
Moulard et al.

(10) Patent No.: US 10,079,334 B2
(45) Date of Patent: Sep. 18, 2018

(54) BAW COMPONENT AND METHOD FOR MANUFACTURING A BAW COMPONENT

(71) Applicant: SNAPTRACK, INC., San Diego, CA (US)

(72) Inventors: Gilles Moulard, Munich (DE); Paul Muralt, La Sarraz (CH); Ramin Matloub, Pully (CH); Thomas Metzger, Munich (DE)

(73) Assignee: SnapTrack, Inc., San Diego, CA (US)

( * ) Notice: Subject to any disclaimer, the term of this patent is extended or adjusted under 35 U.S.C. 154(b) by 530 days.

(21) Appl. No.: 14/654,480

(22) PCT Filed: Dec. 21, 2012

(86) PCT No.: PCT/EP2012/076710
§ 371 (c)(1),
(2) Date: Jun. 19, 2015

(87) PCT Pub. No.: WO2014/094883
PCT Pub. Date: Jun. 26, 2014

(65) Prior Publication Data
US 2015/0333249 A1    Nov. 19, 2015

(51) Int. Cl.
*H03H 9/02* (2006.01)
*H01L 41/083* (2006.01)
(Continued)

(52) U.S. Cl.
CPC ............ *H01L 41/083* (2013.01); *H01L 41/18* (2013.01); *H01L 41/27* (2013.01); *H03H 3/02* (2013.01);
(Continued)

(58) Field of Classification Search
CPC .... H03H 3/02; H03H 9/02015; H03H 9/0576; H03H 9/171; H03H 9/17
(Continued)

(56) References Cited

U.S. PATENT DOCUMENTS 5,929,555 A * 7/1999 Sugimoto ............... H03H 3/04
310/320
6,441,539 B1  8/2002 Kitamura et al.
(Continued)

FOREIGN PATENT DOCUMENTS

DE         60036264 T2    5/2008
DE      102008025691 A1   12/2008
(Continued)

OTHER PUBLICATIONS

Ababneh, A., et al., "Etching behaviour of sputter-deposited aluminium nitride thin films in H3PO4 and KOH solutions," Microsystem Technologies—Micro and Nanosystems Information Storage and Processing Systems, vol. 14, No. 4-5, Jan. 29, 2008, pp. 567-573.
(Continued)

*Primary Examiner* — Derek Rosenau
(74) *Attorney, Agent, or Firm* — Patterson & Sheridan, L.L.P.

(57) ABSTRACT

A BAW component is provided. A method for manufacturing a BAW component is also provided. The component includes a bottom electrode, a top electrode and a first piezoelectric material. The first piezoelectric material is between the bottom electrode and the top electrode. The first piezoelectric material has a higher piezoelectric coefficient than AlN.

7 Claims, 1 Drawing Sheet

(51) Int. Cl.
  *H01L 41/18* (2006.01)
  *H01L 41/27* (2013.01)
  *H03H 3/02* (2006.01)
  *H03H 9/05* (2006.01)
  *H03H 9/17* (2006.01)

(52) U.S. Cl.
  CPC ...... *H03H 9/02015* (2013.01); *H03H 9/0576* (2013.01); *H03H 9/171* (2013.01); *Y10T 29/43* (2015.01)

(58) Field of Classification Search
  USPC .......................................................... 310/320
  See application file for complete search history.

(56) References Cited

U.S. PATENT DOCUMENTS

| | | | |
|---|---|---|---|
| 7,758,979 | B2 | 7/2010 | Akiyama et al. |
| 2002/0121499 | A1 | 9/2002 | Bradley et al. |
| 2002/0153965 | A1 | 10/2002 | Ruby et al. |
| 2005/0012568 | A1 | 1/2005 | Aigner et al. |
| 2007/0063622 | A1* | 3/2007 | Rudy .................. H03H 3/04 310/341 |
| 2008/0024563 | A1 | 1/2008 | Matsui et al. |
| 2008/0296529 | A1* | 12/2008 | Akiyama .............. B81B 3/0021 252/62.9 PZ |
| 2012/0104900 | A1 | 5/2012 | Nishihara et al. |
| 2012/0107557 | A1 | 5/2012 | Akiyama et al. |
| 2012/0293278 | A1 | 11/2012 | Burak et al. |
| 2012/0306591 | A1 | 12/2012 | Nishihara et al. |
| 2013/0127300 | A1 | 5/2013 | Umeda et al. |

FOREIGN PATENT DOCUMENTS

| | | |
|---|---|---|
| DE | 112010002790 T5 | 11/2012 |
| EP | 1100196 A2 | 5/2001 |
| JP | 2001203558 A | 7/2001 |
| JP | 2002359534 A | 12/2002 |
| JP | 2003022074 A | 1/2003 |
| JP | 2007335437 A | 12/2007 |
| JP | 2008041921 A | 2/2008 |
| JP | 2009010926 A | 1/2009 |
| JP | 2009201101 A | 9/2009 |
| JP | 2012100029 A | 5/2012 |
| JP | 2012253497 A | 12/2012 |
| JP | 2013128267 A | 6/2013 |
| JP | 2014030136 A | 2/2014 |

OTHER PUBLICATIONS

Akiyama, M., et al., "Enhancement of Piezoelectric Response in Scandium Aluminum Nitride Alloy Thin Films Prepared by Dual Reactive Cosputtering," Advanced Materials, vol. 21, Issue 5, Feb. 2, 2009, pp. 593-596.
Ho, G.K., et al., "Piezoelectric-on-Silicon Lateral Bulk Acoustic Wave Micromechanical Resonators," Journal of Microelectromechanical Systems, vol. 17, Vo. 2, Apr. 2008, 9 pages.
Jakkaraju, R., et al., "Integrated approach to electrode and AlN depositions for bulk acoustic wave (BAW) devices," Microelectronic Engineering, vol. 70, Nov. 2003, pp. 566-570.
Moreira, M., et al., "Aluminum scandium nitride thin-film bulk acoustic resonators for wide band applications," Vacuum, vol. 86, Jul. 4, 2011, pp. 23-26.
Tadigadapa, S., "Piezoelectric Microelectromechanical Systems—Challenged and Opportunities," Procedia Engineering, Proc. Eurosensors XXIV, vol. 5, Sep. 5-8, 2010, pp. 468-471.
Trolier-McKinstry, S., et al., "Thin Film Piezoelectrics for MEMS," Journal of Electroceramics, vol. 12, Jan. 2004, pp. 7-17.
International Search Report and Written Opinion—PCT/EP2012/076710—ISA/EPO—dated Sep. 6, 2013.
Yanagitani, T. et al.: "(0001) ScAIN Piezoelectric Film Resonators Fabricated by Sputtering of Sc Grain Ingot," The Japan Society of Applied Physics, The 59th Spring Meeting, 18p-C3-1, Mar. 18, 2012, WASEDA University.

* cited by examiner

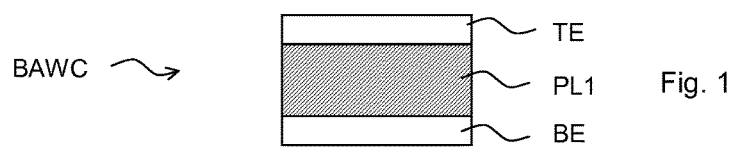
Fig. 1
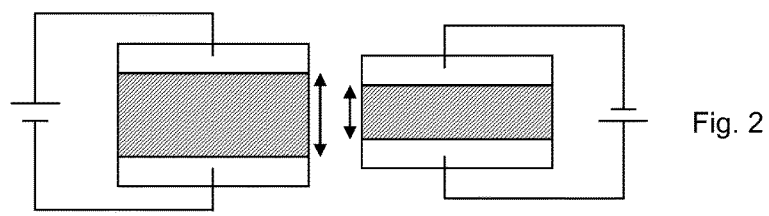
Fig. 2
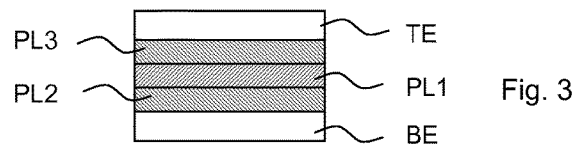
Fig. 3
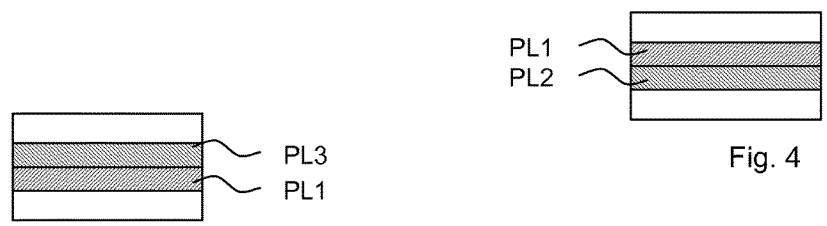
Fig. 4
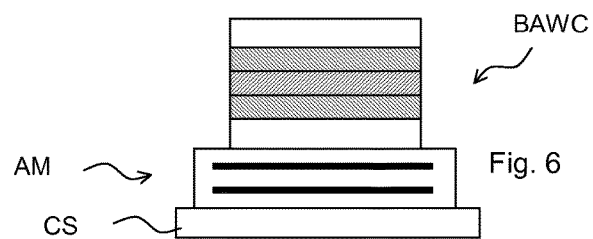
Fig. 5
Fig. 6

BAW COMPONENT AND METHOD FOR MANUFACTURING A BAW COMPONENT

This patent application is a national phase filing under section 371 of PCT/EP2012/076710, filed Dec. 21, 2012, which is incorporated herein by reference in its entirety.

TECHNICAL FIELD

The present invention refers to BAW components (BAW=bulk acoustic wave), e.g., for RF filters, and to methods for manufacturing BAW components.

BACKGROUND

BAW components usually comprise a layer stack with a piezoelectric material sandwiched between two electrodes. When an RF signal is applied to the electrodes, an acoustic resonance can be formed if means for confining acoustic energy in the stack are present. Mirror systems under the stack or a cavity under the stack are typical means for confining the acoustic energy. Utilizing acoustic resonances, band pass filters or band stop filters can be established.

Conventional BAW components comprise AlN (aluminum nitride) as a piezoelectric material. However, the band width of pass bands or stop bands of BAW components are limited. What is needed is a BAW component providing a larger band width.

SUMMARY

Embodiments of the invention provide a BAW component that allows a larger band width and also provide a method for manufacturing such a BAW component.

A BAW component comprises a bottom electrode, a top electrode, and a first piezoelectric layer between the bottom electrode and the top electrode. The first piezoelectric layer comprises a piezoelectric material having a higher piezoelectric coefficient c than AlN.

The piezoelectric behavior of a BAW component or—more generally—of a piezoelectric material is mainly determined by piezoelectric parameters. When an electric field is applied to a piezoelectric material, then a deformation of the material is obtained. Further, when a piezoelectric material is deformed, then an electric charge displacement takes place and an electric field is established. Piezoelectric parameters describe the relationships between deformation and electrical field or between strain and stress. Usually, the piezoelectric parameters are tensors as the directivity of force or of a force, a field or a deformation is relevant.

It is thus possible that the piezoelectric coefficient c is the coefficient $d_{33}$ that describes the relationship between the deformation in a direction parallel to the piezoelectric axis of the piezoelectric material when the electrical field is parallel to the piezoelectric axis. In particular, the piezoelectric coefficient c can be a constant of proportionality when the material works in a linear regime.

It was found that a BAW component having a piezoelectric material with a higher piezoelectric coefficient c than AlN allows larger band widths. However, AlN provides good elastic components as AlN is hard enough to allow only relative small deformations. With only small deformations non-linear effects during the oscillation of the piezoelectric material can be neglected. Thus, when a material being different from AlN is utilized in a BAW component, e.g., to increase the band width, then tradeoffs with deteriorated elastic properties are a result.

In one embodiment, the BAW component comprises Sc (Sc=scandium) doped AlN. Sc containing AlN has a higher piezoelectric coefficient and allows a higher piezoelectric coupling coefficient $\kappa^2$. However, Sc doped AlN is softer than AlN and non-linear effects due to a larger deformation can take place. Further, the insertion loss level of a pass band can be deteriorated.

In one embodiment, the BAW component further comprises a second piezoelectric layer with a second piezoelectric material different from the piezoelectric material of the first piezoelectric layer. The second piezoelectric material is arranged between the bottom electrode and the first piezoelectric layer.

The second piezoelectric material can be chosen according to its piezoelectric properties or according to its elastic properties. Then, the piezoelectric material between the electrodes is a sandwich construction comprising different piezoelectric materials and an improved tradeoff between electric properties and elastic properties can be obtained. However, manufacturing steps are more complex. In particular, the second piezoelectric material can comprise AlN having good elastic properties.

In one embodiment, the BAW component comprises a layer with a second piezoelectric material and the first piezoelectric layer is arranged on the second piezoelectric material. The mismatch of lattice parameters of the first piezoelectric layer's material and the second piezoelectric layer's material is less than 10%. The lattice mismatch can be in the range of 2-5%. When the first piezoelectric layer's material is Sc doped AlN and the second piezoelectric layer's material is AlN, then both materials have a similar lattice. Due to the different sizes of Sc atoms and of Al atoms, a lattice mismatch, however, is present. The doping level can be in the range of 1% to 25%, resulting in a lattice mismatch that is small enough to allow Sc doped AlN to be grown on the lower AlN layer with a good layer quality. In one example the doping level can be in the range of 5% to 7%.

In one embodiment, the second piezoelectric layer has a (002) texturation at the interface towards the first piezoelectric layer.

It is possible that the second piezoelectric material is a seed layer for the first piezoelectric material. It was found that Sc doped AlN grown on an AlN seed layer with a (002) texturation has a good crystalline quality and allows resonators with a high quality factor Q.

The (002) orientation can be easily obtained giving more degrees of freedom in depositing processes. Sputtering can be utilized to deposit electrode or piezoelectric material layers.

In one embodiment, the BAW component comprises a third piezoelectric layer. The third piezoelectric layer is arranged between the first piezoelectric layer and the top electrode.

The third piezoelectric layer can have a piezoelectric material that is different from the piezoelectric material of the first piezoelectric layer and can be chosen according to elastic or piezoelectric properties. In particular in combination with a second piezoelectric layer between the first piezoelectric layer and the bottom electrode, a threefold piezoelectric laminate between the electrodes can be obtained and fulfills modern requirements related to BAW components or RF filters.

Whether a further piezoelectric layer is below or above the first piezoelectric layer, the global piezoelectric coefficient can be increased relative to the piezoelectric coefficient of AlN. Utilizing the combination of AlN and the first material is a possibility to limit the reduction of the quality factor of the respective resonator.

A method for manufacturing a BAW component comprises the steps:
provinding a bottom electrode (BE),
depositing a first piezoelectric material having a higher piezoelectric coefficient c than AlN onto or above the bottom electrode (BE),
structuring a top electrode (TE) onto or above the first piezoelectric material.

In one embodiment, the method further comprises the step of depositing a second piezoelectric material onto or above the bottom electrode before depositing the first piezoelectric material.

In one embodiment of the method, the first piezoelectric material comprises Sc doped AlN. The first piezoelectric material can be deposited at a rate R with 5 µm/h≤R≤15 µm/h. But higher deposition rates are also possible. The first piezoelectric material is deposited at a temperature T with 50° C.≤T≤400° C. Especially, it is possible to use a temperature between 150° C. and 300° C. It was found that the Al/Sc nitride material system, especially an AlN—ScAlN—AlN laminate—provides good elastic and electric properties and can be deposited at a high rate and at a large temperature interval which makes methods for manufacturing BAW components highly efficient.

BRIEF DESCRIPTION OF THE DRAWINGS

Examples and working principles are shown in the schematic figures.

FIG. 1 shows a BAW component with a piezoelectric layer between two electrodes;

FIG. 2 shows the relationship between an electrical field an a mechanical distortion of a piezoelectric material;

FIG. 3 shows a BAW component comprising three piezoelectric layers between two electrodes;

FIG. 4 shows a BAW component with a second piezoelectric layer between the first piezoelectric layer and a bottom electrode;

FIG. 5 shows a BAW component with a third piezoelectric layer between the first piezoelectric layer and an top electrode; and FIG. 6 shows a BAW resonator with an acoustic mirror.

DETAILED DESCRIPTION OF ILLUSTRATIVE EMBODIMENTS

FIG. 1 shows a BAW component BAWC comprising a bottom electrode BE and a top electrode TE. Between the two electrodes, a first piezoelectric layer PL1 is arranged. The first piezoelectric layer PL1 comprises a piezoelectric material having a higher piezoelectric coefficient c than AlN.

FIG. 2 shows two versions of a piezoelectric material being arranged between two electrodes. An electric voltage is applied to the electrodes resulting in an electric field causing the piezoelectric material to expand in a vertical direction which may be a direction parallel to the piezoelectric axis. In contrast, a reverse voltage, i.e., the same voltage with different sign, is applied to the piezoelectric material as shown in the piezoelectric material on the right-hand side. The electrical field causes the piezoelectric material to shrink in a vertical direction.

FIG. 3 shows a BAW component comprising a second piezoelectric layer PL2 between the first piezoelectric layer PL1 and the bottom electrode. Further, a third piezoelectric layer PL3 is arranged between the first piezoelectric layer PL1 and the top electrode TE. The materials of the piezoelectric layer and the respective layer thicknesses can be chosen to provide an excellent BAW component as the materials and the thicknesses can be chosen to fulfill elastic and electric requirements.

FIG. 4 shows an embodiment of a BAW component where the third piezoelectric layer PL3 shown in FIG. 3 is omitted.

FIG. 5 shows the BAW component where the second piezoelectric layer PL2 of FIG. 3 is omitted.

FIG. 6 shows a BAW component BAWC where an acoustic mirror AM is arranged between the layer stack with the electrodes and the piezoelectric material on one side and a carrier substrate CS on the other side. The acoustic mirror AM is a possibility to confine acoustic energy in the stack so that a resonance can be established. The acoustic mirror AM can comprise two or more layers with alternating acoustic impedance.

A BAW component or a method for manufacturing BAW components are not limited to the embodiments described in the specification or shown in the figures. Components comprising further elements such as layers or materials or methods comprising further deposition steps or structuring steps or combinations thereof are also comprised by the present invention.

The invention claimed is:
1. A bulk acoustic wave (BAW) component, comprising:
a bottom electrode;
a top electrode;
a first piezoelectric layer between the bottom electrode and the top electrode, wherein the first piezoelectric layer comprises a first piezoelectric material having a higher piezoelectric coefficient than aluminum nitride (AlN); and
a second piezoelectric layer between the bottom electrode and the first piezoelectric layer, wherein the second piezoelectric layer comprises a second piezoelectric material that is a different material than the first piezoelectric material.

2. The BAW component of claim 1, wherein the piezoelectric material comprises scandium (Sc) doped AlN.

3. The BAW component of claim 1, wherein a lattice parameter mismatch of the first piezoelectric layer's material and the second piezoelectric layer's material is less than 10%.

4. The BAW component of claim 1, wherein the second piezoelectric layer has a (002) texturation at an interface towards the first piezoelectric layer.

5. The BAW component of claim 1, further comprising a third piezoelectric layer between the first piezoelectric layer and the top electrode.

6. The BAW component of claim 5, wherein the third piezoelectric layer comprises a third piezoelectric material that is a different material than the first piezoelectric material.

7. The BAW component of claim 1, wherein the second piezoelectric layer comprises AlN.

* * * * *